United States Patent [19]

Ranon

[11] Patent Number: 4,996,494
[45] Date of Patent: Feb. 26, 1991

[54] DROOP COMPENSATED PFN DRIVEN TRANSFORMER FOR GENERATING HIGH VOLTAGE, HIGH ENERGY PULSES

[75] Inventor: Peter M. Ranon, Albuquerque, N. Mex.

[73] Assignee: The United States of America as represented by the Secretary of the Air Force, Washington, D.C.

[21] Appl. No.: 366,944

[22] Filed: Jun. 15, 1989

[51] Int. Cl.$^5$ .............................................. H03K 3/01
[52] U.S. Cl. ..................................... 328/65; 307/106; 307/108; 307/260; 307/268
[58] Field of Search ............... 307/106, 108, 260, 268; 328/65, 67

[56] References Cited

U.S. PATENT DOCUMENTS

| | | | |
|---|---|---|---|
| 2,666,849 | 1/1954 | Johnson et al. | 328/65 |
| 2,928,999 | 3/1960 | Vinding | 307/106 |
| 3,090,010 | 5/1963 | Zavales | 328/67 |
| 3,171,040 | 2/1965 | Goebel | 328/67 |
| 3,221,185 | 11/1965 | Cubert et al. | 307/268 |
| 3,309,532 | 3/1967 | Frye | 307/268 |
| 3,333,120 | 7/1967 | Tomlin | 307/106 |
| 3,375,378 | 3/1968 | Vandemore et al. | 328/67 |
| 3,393,368 | 7/1968 | Coyle | 328/67 |
| 3,860,864 | 1/1975 | Fitz | 321/18 |
| 3,878,449 | 3/1975 | Wilhelmi et al. | 307/108 |
| 4,024,430 | 5/1977 | Schneider | 315/289 |
| 4,082,965 | 4/1978 | Hornbeck et al. | 307/260 |
| 4,087,755 | 5/1978 | LeGrand | 325/151 |
| 4,157,579 | 6/1979 | Paul | 361/156 |
| 4,187,458 | 2/1980 | Milberger et al. | 323/17 |
| 4,421,993 | 12/1983 | Bloomer | 307/126 |
| 4,600,411 | 7/1986 | Santamaria | 55/139 |
| 4,635,265 | 1/1987 | O'Harra, II | 372/25 |
| 4,758,736 | 3/1986 | Agoston et al. | 307/268 |
| 4,774,517 | 9/1988 | Cervone et al. | 342/202 |

FOREIGN PATENT DOCUMENTS 0792567 1/1981 U.S.S.R. ............................ 307/108

OTHER PUBLICATIONS

Article by P. M. Ranon, et al., entitled "Compact Pulsed Transformer Power Conditioning System for Generating High Voltage, High Energy Rapid Risetime Pulses," published as a Conference Proceedings of the 4th Symposium on Electromagnetic Launch Technology, Apr. 19-21, 1988.

Primary Examiner—Stanley D. Miller
Assistant Examiner—T. Cunningham
Attorney, Agent, or Firm—William G. Auton; Donald J. Singer

[57] ABSTRACT

A pulse forming system for providing constant power pulses for variably resistive loads is disclosed. It includes a high voltage power source, a pulse forming network, and a transformer circuit. The high voltage power source outputs a voltage signal with a level of about 200 kV. The pulse forming network receives the voltage signal and outputs a droop compensated rectangular pulse with a selected pulse width, a selected PFN frequency at a first voltage level and a first current value. The transformer receives and transforms the output of the pulse forming network into a selected voltage level and a selected current value for the load while retaining the selected pulse width and PFN frequency.

16 Claims, 7 Drawing Sheets

100 GW, 250 kJ PULSE.

100 GW, 500 kJ PULSE.

100 GW, 1000 kJ PULSE.

EFFECT OF EVEN UNCHARGED CAPACITORS.

DROOP COMPENSATED PFN DRIVEN TRANSFORMER FOR GENERATING HIGH VOLTAGE, HIGH ENERGY PULSES

The invention described herein may be manufactured and used by or for the Government for governmental purposes without the payment of any royalty thereon.

BACKGROUND OF THE INVENTION

The present invention relates generally to pulsed power systems, and more specifically the invention pertains to a synthesis of pulse forming networks for generating flat top, constant power pulses into variable resistive loads from pulsed transformers.

High power pulse forming networks (PFN) have been in use for some time. The networks are usually designed using techniques that assume a desired pulse shape and a constant resistive load. High power gaseous discharge devices have created a need for high power pulse generation operating into time-varying resistive loads or nonlinear resistive loads. Although some work has been done in designing a PFN with a time-varying load, little has been done for the nonlinear loads in general.

The task of providing a high power pulse forming network for generating constant power pulses into variable resistive loads is alleviated, to some extent, by the systems disclosed in the following U.S. Patents, the disclosures of which are specifically incorporated herein by reference:

U.S. Pat. No. 4,774,517 issued to Cervone et al;
U.S. Pat. No. 4,635,265 issued to O'Hara;
U.S. Pat. No. 4,600,411 issued to Santamaria;
U.S. Pat. No. 4,421,993 issued to Bloomer;
U.S. Pat. No. 4,187,458 issued to Milberger et al;
U.S. Pat. No. 4,087,755 issued to LeGrand;
U.S. Pat. No. 4,082,965 issued to Hornbeck et al;
U.S. Pat. No. 4,024,430 issued to Schneider; and
U.S. Pat. No. 3,860,864 issued to Fitz.

As described above, many achievements in designing high power pulse forming networks have been developed. However, consistent with the continuing development of pulse-power technology, more exotic applications have arisen. Whenever producing various pulse shapes for complex but resistive loads is necessary, the design procedure is usually not well-defined. A need remains to provide a pulse forming network system for generating flat top, constant power pulses into variable resistive loads from pulsed transformers. The present invention is intended to satisfy that need.

SUMMARY OF THE INVENTION

The present invention includes a droop compensated, pulse forming network driven transformer system which provides flat top, constant power, high voltage pulses into variable resistive loads using: a clock spring wound transformer, a high voltage source, and a droop compensated pulse forming network system.

The high voltage source is electrically connected with the pulse forming network, and provides it with voltages on the order of 200 KV. The droop compensated PFN contains two banks of inductor-capacitor elements with values which are determined in accordance with the design principles discussed below. The PFN generates a rectangular wave output or pulse which is sent to the transformer.

The clock spring wound transformer is electrically connected between the PFN and the load to produce an output signal which has the same frequency as the signals it receives, but produced with a different voltage level, and a different current value.

The clock spring wound transformer is an electrical element composed of a single-turn primary inductor which is in a parallel circuit with a multi-turn secondary inductor. This element has electrical characteristics defined by the terms $L_1$, $L_2$ and $M$ which respectively are: the self inductance of the primary inductor, the self inductance of the secondary inductor, and the mutual inductance between the primary and secondary inductors.

Once $L_2$ is determined (by selecting a specific transformer for the desired application) along with $T$ (the desired pulse width to be produced by the PFN) and $R$ (the average impedance of the load) the characteristics of the droop compensated pulse forming network are given by the following equations.

Bank of Odd $LC$ Elements:

$$L_n = \frac{1}{4 + 2(RT/L_2)}$$

$$C_n = \frac{4 + 2(RT/L_2)}{n^2 \pi^2}$$

Bank of Even $LC$ Elements:

$$L_n = \frac{1}{(2RT/L_2)}$$

$$C_n = \frac{(2RT/L_2)}{n^2 \pi^2}$$

One embodiment of the invention provides signals with pulse lengths of 2.5 μs, 5.0 μs and 10.0 μs and delivers 250 kJ, 500 kJ, and 1000 kJ from a 100 GW pulser, using a PFN with 10 inductor and capacitor elements ($L_1$–$L_{10}$ and $C_1$–$C_{10}$), and five resistors which are arranged in two banks of components. The first bank of the inductor-capacitor elements contains five strings of capacitor-inductor-resistor elements in which each string contains a capacitor, an inductor and a resistor which are electrically connected in a series circuit between the high voltage source and the transformer. Each of these five strings is also in a parallel circuit with each other, with the values of the capacitors and inductors determined by the first two equations presented above.

The second bank of inductor-capacitor elements contains five strings each of which contains an inductor and capacitor which are electrically connected in a series circuit between a common electrical ground, and a node where the first bank is electrically connected with the transformer. Each of the five strings is in a parallel circuit with each other with elements which have values determined by the last two equations listed above.

In operation, tests have shown that the droop compensated PFN driven transformer is able to drive a flat top constant power pulse into variable loads. It is useful in applications requiring high voltage (200 KV) such as radar transmitters, to generate 100 GW high energy (250–1,000 kJ) pulses into variable resistive loads.

It is an object of the present invention to provide a source of droop compensated rectangular wave pulses for use by variable resistive loads.

It is another object of the present invention to provide a high voltage pulse forming network and transformer system which outputs high energy, rectangular, constant power, flat top pulses into variable loads.

These objects with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention includes a droop compensated pulse forming network driven transformer for generating high voltage, high energy pulses.

Figure 1:
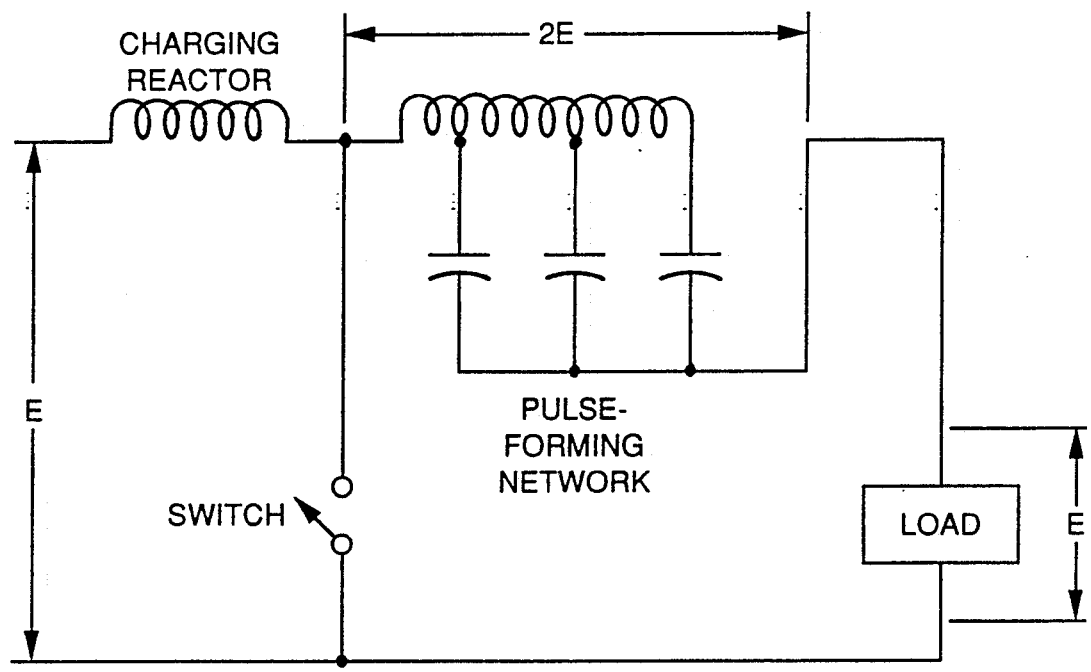
FIG. 1 is an electrical schematic of a prior art pulse forming network.

The reader's attention is now directed towards FIG. 1, which is a schematic of a prior art pulse forming network. A pulse forming network is a circuit which converts the output of either an AC or DC charging source into an approximately rectangular wave output. The nature of such circuits are described in detail in a text by G.N. Glasoe and J.V. Lebacqz entitled "Pulse Generators (MIT Radiation Laboratory Series No. 5)" which was published by McGraw-Hill Book Company, Inc., New York, 1948.

The term "pulse shape" is used to refer to the form obtained when the pulse amplitude is plotted as a function of time. When referring to such a plot, it is convenient to discuss the details of a particular pulse shape in terms of the "leading edge," the "top," and the "trailing edge" of the pulse. If a pulse of voltage or current is truly rectangular in shape, that is, has a negligible time of rise and fall and is of constant amplitude for the intervening time interval, the pulse duration is simply the time elapsed between the deviation from and the return to the initial value. The term "negligible time" is, of course, relative and no strict boundaries can be attached. For most practical purposes, however, if the rise and fall times for a pulse are about a tenth or less of the pulse duration, the pulse is considered substantially rectangular.

Figure 2:
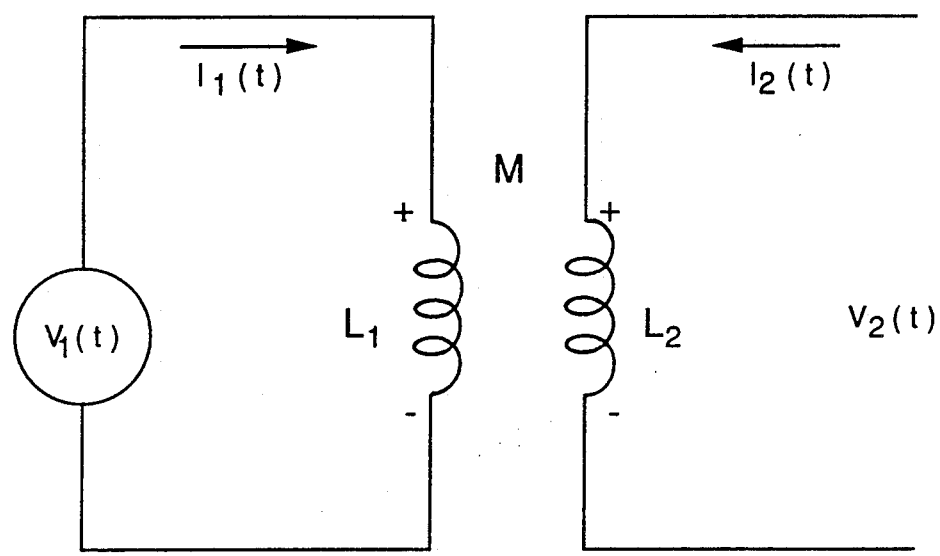
FIG. 2 is an electrical schematic of a prior art transformer circuit.

The reader's attention is now directed towards FIG. 2, which is an electrical schematic of a prior art transformer. The transformer of FIG. 2 is an electrical device which, by magnetic induction, transforms electrical energy from a source, such as the PFN of FIG. 1, to a resistive load at the same frequency, but with a different voltage level and current value. The transformer of FIG. 2 transforms the voltage of $V_1(t)$ into the voltage level of $V_2(t)$ using two adjacent inductors defined by the quantities of $L_1$, $L_2$ and $M$, which are the self inductance characteristics of the two coils, and the mutual inductance. Kerchoff's voltage law for the circuit of FIG. 2 may be expressed as:

$$L_1 \frac{dI_1(t)}{dt} + M \frac{dI_2(t)}{dt} = V(t) \text{ and}$$

$$-M \frac{dI_1(t)}{dt} - \left[ L_2 \frac{d}{dt} + R \right] \cdot I_2(t) = 0$$

where R is the load supported by the transformer of FIG. 2 across voltage $V_2(t)$.

Figure 3:
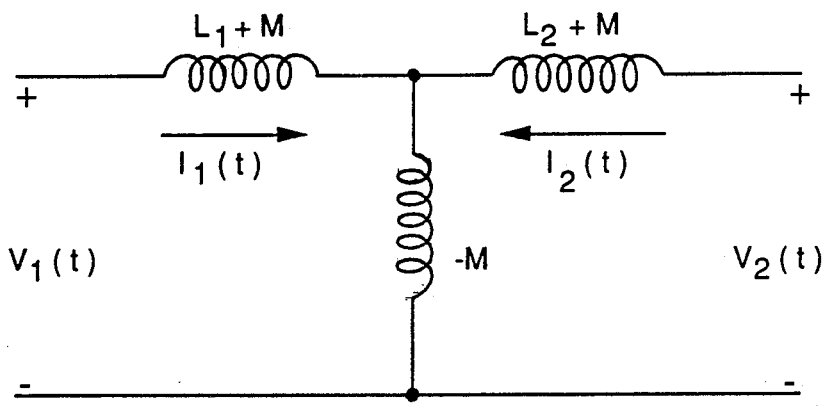
FIG. 3 is a schematic of transformer circuit which is the electrical equivalent of the one depicted in FIG. 2.

FIG. 3 is a circuit diagram which is equivalent to that of FIG. 2, and it includes three induction coils in a circuit which receives a voltage and current $V_1(t)$ and $I_1(t)$ and outputs a voltage and current $V_2(t)$ and $I_2(t)$ given by the following matrix equation.

$$\begin{bmatrix} V_1(t) \\ V_2(t) \end{bmatrix} = \begin{bmatrix} L_1 \frac{d}{dt} & -M \frac{d}{dt} \\ -M \frac{d}{dt} & L_2 \frac{d}{dt} \end{bmatrix} \cdot \begin{bmatrix} I_1(t) \\ I_2(t) \end{bmatrix} \quad (1)$$

By defining $V_2(t) = -i_2(t) \cdot R$, and $i_2(t) = I_2 \cdot u(t)$, the required current pulse on the primary side may be obtained by solving the following equation:

$$i_1(t) = \frac{1}{M} \int_0^t \left[ -\frac{d}{d\tau} L_2 + R \right] i_2(\tau) d\tau \quad (2)$$

In this application, there are two general types of load: the linear load, such as a pure resistance, and the nonlinear load, such as the magnetron. The magnetron load can be approximately represented as a biased diode with a dynamic resistance that is low and a static resistance that is about ten times higher. Static resistance is the ratio of the voltage across the load to the current through the load, whereas the dynamic resistance is the ratio of a small change in voltage to the corresponding change in current.

Pulse forming networks can be used to generate flat pulses to matched loads, but when this flat top waveform is fed to a transformer, usually for voltage step-up, the pulse inherently droops at the output. This effect is especially pronounced for long pulses, and limits the usable pulse duration, from the PFN, if droop cannot be tolerated. The method of droop compensation of the present invention approaches the problem from the load rather than the driver. If a required flat top pulse on the secondary side $(i_2(t) = I_2[u(t) - u(t-T)]$ is reflected back, it will determine the necessary waveform for the PFN. The required input pulse must consist of both even and odd term; even terms are sinks (uncharged capacitors), while the odd terms are sources (charged capacitors). Even though the derivations given are for a rectangular pulse, one may use a trapezoidal current pulse, or a flat top pulse with parabolic rise and fall, which will provide rapid convergeance of the series for the output pulse. The network described below is normalized so that the scaling laws, typical of PFN designs, can be applied. Unlike crow-barred Marx generators, PFN driven pulse transformers are highly efficient, and seem particularly feasible for high voltage, long pulse applications. The examples given below are generating 100 GW, High Energy Pulses (250 kJ –1000 kJ) into resistive load 2 Ohms–10 Ohms) from a 200 KV PFN.

A dirac delta voltage ($\delta(t)$) is an obvious result of a unit step current in an inductor. This is not a problem, since an IC network fed transformer will not allow a unit step current. But as an analysis tool, it is considerably easier to analyze step inputs. The solution to Eq. 2 is the following, $$i(t) = \left[ \frac{L_2}{M} I_2 + \frac{R}{M} I_2 t \right] u(t) \quad (3)$$

Figure 4:
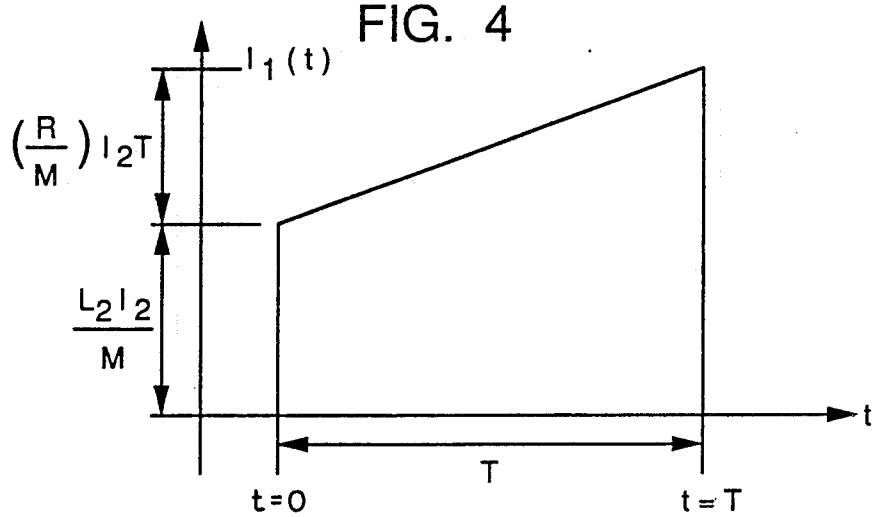
FIG. 4 is a chart of a desired input pulse.
Figure 5:
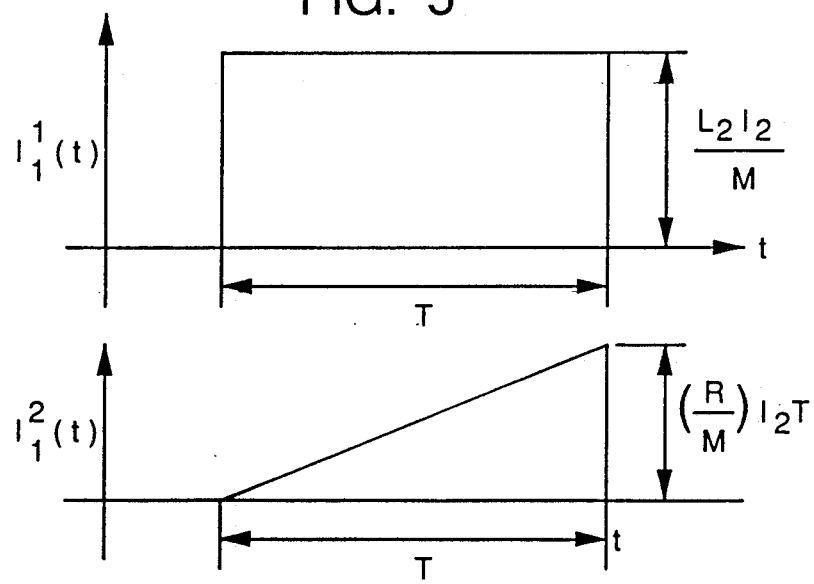
FIG. 5 is a chart of the two components of the pulse of FIG. 4.

The required input pulse is shown in FIG. 4. By taking an odd extension, the pulse can be decomposed into two parts, as shown in FIG. 5. A Fourier Series analysis is now necessary to solve for the constituent harmonics of the input pulse. By making the following substitutions:

$$\frac{L_2}{M} I_2 = A \quad (4)$$

$$\frac{R}{M} I_2 T = a \quad (5)$$

The decomposed Fourier series of Equation 3 is simplified as $$f(t) = \sum_{odd}^{\infty} \left[ \frac{4 + 2(a/A)}{n\pi} \right] \sin\omega_n t - \sum_{even}^{\infty} \left[ \frac{2(a/A)}{n\pi} \right] \sin\omega_n t \quad (6)$$

Fourier coefficients may now be analyzed to determine the necessary component values. It is desirable to analyze the odd and even terms separately since odd and even coefficients do not have the same form. A type C PFN will be derived since it is far the easiest to realize numerically.

The normalized impedance necessary for the odd components are, $$[L_n/C_n]^{\frac{1}{2}} = \frac{n\pi}{4 + 2(a/A)} \quad (7)$$

and the required frequencies are $$[L_n C_n]^{-\frac{1}{2}} = n\pi \quad (8)$$

By solving the simultaneous equations above $L_n$ and $C_n$ are found to be $$L_n = \frac{1}{4 + 2(a/A)} \quad (9)$$

$$C_n = \frac{4 + 2(a/A)}{n^2\pi^2} \quad (10)$$

As stated earlier, the negative signs in front of the even terms require that they be sinks, or the capacitors in that branch be uncharged. As above, the normalized impedance necessary for the even components are $$[L_n/C_n]^{\frac{1}{2}} = \frac{n\pi}{2(a/A)} \quad (11)$$

and the required frequencies $$[L_n C_n]^{-\frac{1}{2}} = n\pi \quad (12)$$

Again, by solving the simultaneous equations above $L_n$ and $C_n$ are found to be $$L_n = \frac{1}{2(a/A)} \quad (13)$$

$$C_n = \frac{2(a/A)}{n^2\pi^2} \quad (14)$$

To the above even and odd coefficients, the standard PFN normalization technique may be employed such that $$\overset{\bullet}{L}_n = (Z^*\tau)L_n \quad (15)$$

$$\overset{\bullet}{C}_n = (\tau/Z)C_n \quad (16)$$

Consider Equations 9, 10, 13 and 14. It is impossible to realize the component values without substituting back into Equations 4 and 5. Rewritten, they are $$L_n = \frac{1}{4 + 2(RT/L_2)} \quad (17)$$

$$C_n = \frac{4 + 2(RT/L_2)}{n^2\pi^2} \quad (18)$$

$$L_n = \frac{1}{(2RT/L_2)} \quad (19)$$

$$C_n = \frac{(2RT/L_2)}{n^2\pi^2} \quad (20)$$

It is easy to determine R and T, but $L_2$ is associated with a specific transformer.

Suppose it is desirable to obtain a 1 MV pulse across a 10 Ohm load. The clock spring wound transformer, shown in FIG. 6, could produce the required output listed in Table 1. The dimensionless parameter $2RT/L_2$ has 3 degrees of freedom. If T is fixed, and R and $L_2$ are specified so that $2RT/L_2$ is still constant, the PFN will be able to drive a flat top constant power pulse into variable loads ranging from 0.1 Ohm to 10 Ohms by replacing transformer-load combinations. Such transformer-load combinations are listed in Table 2.

TABLE 1

| Required 1 MV Transformer Parameters | | | |
| --- | --- | --- | --- |
| Primary Winding | 250 kJ | 500 kJ | 1000 kJ |
| Inner Radius | 26.58 cm | 36.58 cm | 51.58 cm |
| Thickness | 0.3175 cm | 0.3175 cm | 0.3175 cm |
| Width | 105.0 cm | 105.0 cm | 105 cm |
| Inductance | 219.2 nH | 386.2 nH | 696.1 nH |
| Secondary Winding | | | |
| Number of Turns | 10 | 10 | 10 |
| Inner Radius | 25.00 cm | 35.00 cm | 50.00 cm |
| Thickness | 0.0508 cm | 0.0508 cm | 0.0508 cm |
| Pitch | 0.1575 cm | 0.1575 cm | 0.1575 cm |
| Width | 100.0 cm | 100.0 cm | 100.0 cm |
| Inductance | 20.76 μH | 37.44 μH | 68.61 μH |
| Coupling Coefficient | 0.9641 | 0.9719 | 0.9780 |

TABLE 1-continued

| Required 1 MV Transformer Parameters | | | |
|---|---|---|---|
| Mutual Inductance | 2.056 μH | 3.696 μH | 6.758 μH |

TABLE 2

| | Required Transformer - Load Combination* | | | | | | |
|---|---|---|---|---|---|---|---|
| Turns Ratio | Secondary Inductance | | | Coupling Coefficient | | | Load Resistance |
| | 250 kJ | 500 kJ | 1000 kJ | 250 Kj | 500 kJ | 1000 kJ | |
| 1:10 | 20.76 μH | 37.44 μH | 68.61 μH | 0.9641 | 0.9719 | 0.9780 | 10.0 ohms |
| 1:9 | 16.76 μH | 30.27 μH | 55.51 μH | 0.9663 | 0.9736 | 0.9794 | 8.1 ohms |
| 1:8 | 13.20 μH | 23.87 μH | 43.81 μH | 0.9685 | 0.9754 | 0.9808 | 6.4 ohms |
| 1:7 | 10.08 μH | 18.24 μH | 33.51 μH | 0.9703 | 0.9768 | 0.9819 | 4.9 ohms |
| 1:6 | 7.38 μH | 13.37 μH | 24.59 μH | 0.9726 | 0.9786 | 0.9834 | 3.6 ohms |
| 1:5 | 5.11 μH | 9.27 μH | 17.06 μH | 0.9748 | 0.9804 | 0.9848 | 2.5 ohms |
| 1:4 | 3.26 μH | 5.92 μH | 10.92 μH | 0.9771 | 0.9822 | 0.9862 | 1.6 ohms |
| 1:3 | 1.83 μH | 3.33 μH | 6.13 μH | 0.9789 | 0.9837 | 0.9874 | 0.9 ohms |
| 1:2 | 0.81 μH | 1.48 μH | 2.72 μH | 0.9811 | 0.9854 | 0.9887 | 0.4 ohms |

*Dimensions taken from Table 1

Pulse lengths of 2.5 μs, and 5.0 μs, and 10.0 μs are required to deliver 250 kJ, 500 kJ, and 1000 kJ from a 100 GW pulser. The dimensionless parameter $2RT/L_2$ is 2.408, 2.671, and 2.915, for these three pulse length-transformer combinations respectively. These values of $2RT/L_2$ can be substituted into Equations 17 through 20 to obtain the normalized component values required for the PFN (see FIG. 7). The normalized component values are listed in Table 3. The scaled values corresponding to actual components are listed in Table 4.

Figure 6:
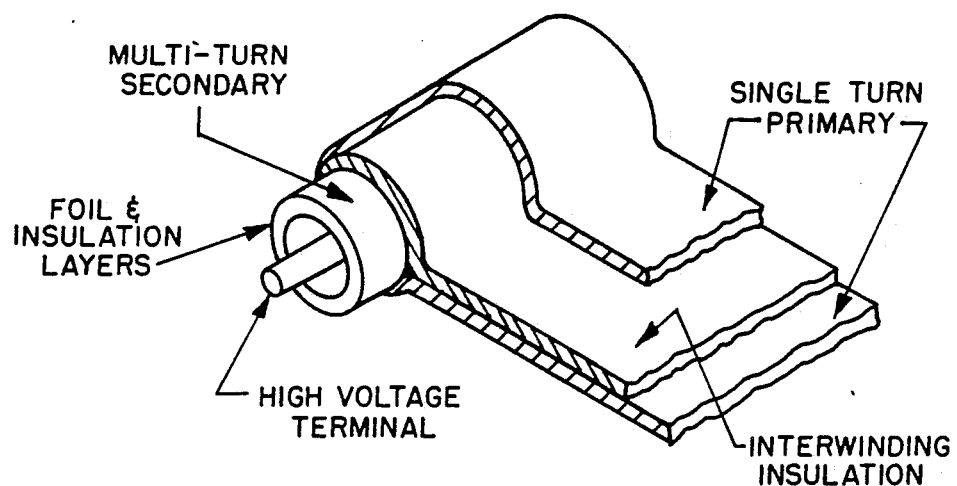
FIG. 6 is an illustration of a clock spring wound transformer which may be used with the pulse forming network of the present invention.
Figure 7:
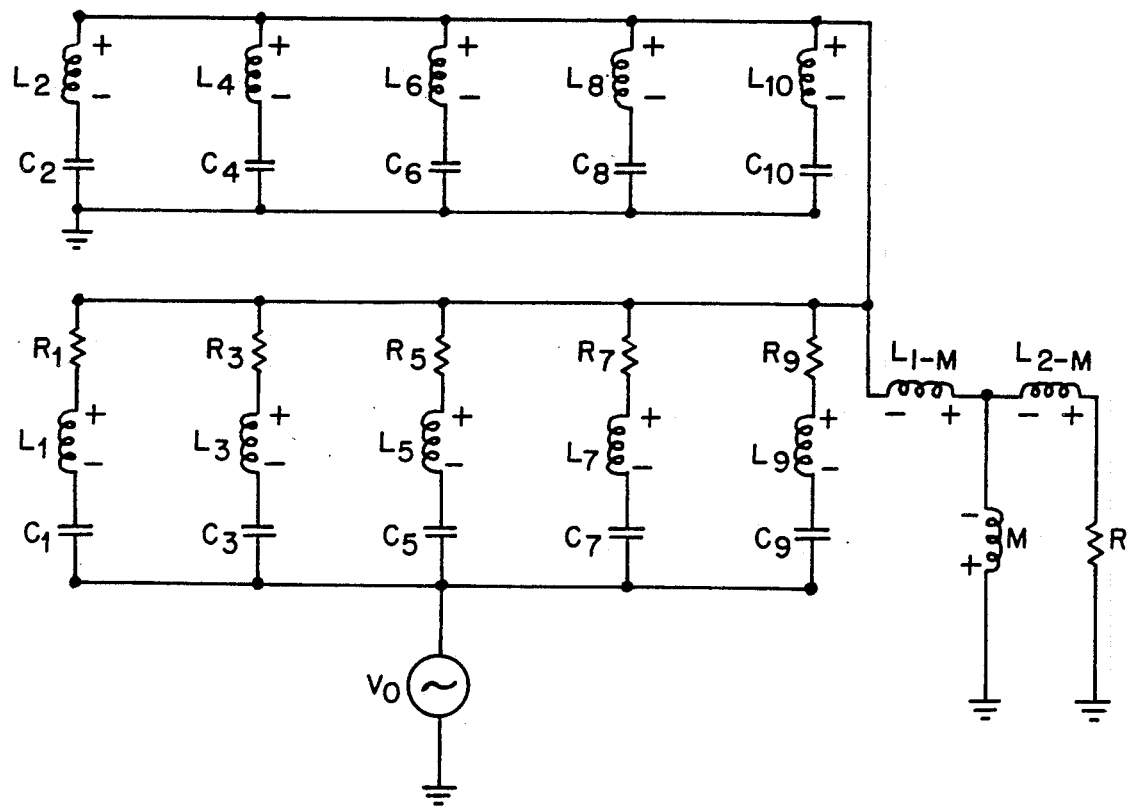
FIG. 7 is an electrical schematic of the droop compensated PFN driven transformer system of the present invention.

FIG. 7 is an electrical schematic of an embodiment of the droop compensated PFN driven transformer of the present invention. The transformer portion of FIG. 7 is depicted as the three inductors designated as $L_{1-M}$, M, and $L_{2-M}$ which were discussed above in conjunction with FIG. 3. In reality, the actual transformer used with the present invention would resemble that depicted in FIG. 2, and in the preferred embodiment of the invention, the clock spring wound transformer of FIG. 6 is used.

The pulse forming network position of FIG. 7 includes two banks of inductor-capacitor (LC) elements designated as: $L_{1-L10}$, $C_1-C_{10}$, resistors $R_1-R_9$, and a voltage source $V_0$. The first bank of inductor-capacitor elements is the bank of even elements whose values are listed in Tables 3 and 4. These values are determined by

TABLE 3

| | Normalized Component Values | | |
|---|---|---|---|
| 2(a/A) Component | 2.408 Values | 2.671 Values | 2.915 Values |
| $C_1$ | 0.6493 | 0.6759 | 0.7006 |
| $L_1$ | 0.1561 | 0.1499 | 0.1446 |
| $C_2$ | 0.610 | 0.0677 | 0.0738 |
| $L_2$ | 0.4153 | 0.3744 | 0.3431 |
| $C_3$ | 0.0721 | 0.0751 | 0.0778 |
| $L_3$ | 0.1561 | 0.1499 | 0.1446 |
| $C_4$ | 0.0152 | 0.0169 | 0.0185 |
| $L_4$ | 0.4153 | 0.3744 | 0.3431 |
| $C_5$ | 0.0260 | 0.0270 | 0.0280 |
| $L_5$ | 0.1561 | 0.1499 | 0.1446 |
| $C_6$ | 0.0068 | 0.0075 | 0.0082 |
| $L_6$ | 0.4153 | 0.3744 | 0.3431 |
| $C_7$ | 0.0133 | 0.0138 | 0.0143 |
| $L_7$ | 0.1561 | 0.1499 | 0.1446 |
| $C_8$ | 0.0038 | 0.0042 | 0.0046 |
| $L_8$ | 0.4153 | 0.3744 | 0.3431 |
| $C_9$ | 0.0080 | 0.0083 | 0.0086 |
| $L_9$ | 0.1561 | 0.1499 | 0.1446 |

TABLE 3-continued

| | Normalized Component Values | | |
|---|---|---|---|
| 2(a/A) Component | 2.408 Values | 2.671 Values | 2.915 Values |
| $C_{10}$ | 0.0024 | 0.0027 | 0.0030 |
| $L_{10}$ | 0.4153 | 0.3744 | 0.3431 |

TABLE 4

| | Required PFN Component Values | | |
|---|---|---|---|
| 2(RT/$L_2$) Component | 250 kJ 2.408 Values | 500 kJ 2.671 Values | 1000 kJ 2.915 Values |
| $C_1$ | 16.23 μF | 33.80 μF | 70.06 μF |
| $L_1$ | 39.0 nH | 75.0 nH | 144.6 nH |
| $C_2$ | 1.53 μF | 3.39 μF | 7.38 μF |
| $L_2$ | 103.8 nH | 187.2 nH | 343.1 nH |
| $C_3$ | 1.80 μF | 3.76 nF | 7.78 μF |
| $L_3$ | 39.0 nH | 75.0 nH | 144.6 nH |
| $C_4$ | 380.0 nF | 845.0 μF | 1.85 μF |
| $L_4$ | 103.8 nH | 187.2 nH | 343.1 nH |
| $C_5$ | 650.0 nF | 1.35 μF | 2.80 μF |
| $L_5$ | 39.0 nH | 75.0 nH | 144.6 nH |
| $C_6$ | 170.0 nF | 375.0 nF | 820.0 nF |
| $L_6$ | 103.8 nH | 187.2 nH | 343.1 nH |
| $C_7$ | 332.5 nF | 690.0 nF | 1.43 μF |
| $L_7$ | 39.0 nH | 75.0 nH | 144.6 nH |
| $C_8$ | 95.0 nF | 210.0 nF | 460.0 nF |
| $L_8$ | 103.8 nH | 187.2 nH | 343.1 nH |
| $C_9$ | 200.0 nF | 415.0 nF | 860.0 nF |
| $L_9$ | 39.0 nH | 75.0 nH | 144.6 nH |
| $C_{10}$ | 60.0 nF | 135.0 nF | 300.0 nF |
| $L_{10}$ | 103.8 nH | 187.2 nH | 343.1 H | equations 11 and 20 as follows. The resistor $R_1-R_9$ are each assigned the average value of the impedance of the load R.

For a pulse length of 2.5 μs, a 10 ohm resistance R, the even inductor elements of FIG. 7 would have values given by equation 19. For the transformer discussed above $L_2$ is defined in Table 1 as being 20.76 μH. Since $L_n$ is given as $1/(2RT/L_2)$ this equals about 0.4153 μH. For this reason, Table 3 lists all of the even PFN inductors for this application as having a value of 0.4153 μH.

As discussed above, R (the load impedance) T (The pulse width) and $L_2$ (the inductance of the secondary winding of the transformer) may vary with different requirements of different systems. However, the invention may be applied to each of these different systems with the following design principles. First, the values for R, T, and $L_2$ for each application should be identified. Second, the droop compensated PFN driven transformer of FIG. 7 should be applied with the values of the elements determined by Equations 17–20 as described above: Equations 17 and 18 determine the values of odd LC elements, and Equations 19 and 20 determine the values of even LC elements.

When a clock spring wound transformer (shown in FIG. 6) is used, a single-turn primary inductor may be used with a multiple-turn secondary inductor using the transformer parameters of Tables 1 and 2.

Note that the nature of the clock spring wound transformer was described in an article by P.M. Ranon, et al, entitled "Compact Pulsed Transformer Power Conditioning System for Generating High Voltage, High Energy, Rapid Risetime Pulses," published as a Conference Proceedings of the 4th Symposium on Elecromagnetic Launch Technology, Apr. 19–21, 1988, the disclosure of which is incorporated herein by reference. Additionally, the present invention was described in an article by P.M. Ranon, et al, entitled "Synthesis of Droop Compensated Pulsed Forming Networks for Generating Flat Top, High Energy Pulses into Variable Loads from Pulsed Transformers, Eighteenth (18th) Power Modulator Symposium, June 20–22, 1988, p. 54–61, the disclosure of which is incorporated herein by reference.

The risetime associated with a PFN is determined by the highest harmonic injected. The networks derived in our analyses are for 10 stage PFN's, but, the highest source is the 9th harmonic. The 10th harmonic is a sink. By using a sine approximation of the pulse, the risetimes can be shown to be $$t_r(PFN) \simeq 1.02 \, L_9 C_9 \quad (21)$$

Equation 21 yields risetimes of 90 ns, 180 ns and 360 ns, for 250 kJ, 500 kJ, and 1000 kJ pulses, respectively. This is not the only limiting factor for this system. Another is the risetime associated with the transformer, shown below.

The risetime determined by the transformer can be shown to be:

$$t_r = 2.2 \frac{L_2}{R} (1 - k^2) \quad (22)$$

Equations 21 and 22 compete so that $t_r(PFN)$ must be less than $t_r(Transformer)$. The injected input signal should have a risetime less than or equal to the transformer risetime. The results for some transformer-load combinations are given in Table 5.

TABLE 5

| | Transformer Risetimes | | |
|---|---|---|---|
| Turns Ratio | 250 kJ | 500 kJ | Risetime 1000 Kj |
| 1:10 (R = 10.0) | 320 ns | 460 ns | 670 ns |
| 1:9 (R = 8.1) | 300 ns | 430 ns | 620 ns |
| 1:8 (R = 6.4) | 280 ns | 400 ns | 580 ns |
| 1:7 (R = 4.9) | 260 ns | 380 ns | 540 ns |
| 1:6 (R = 3.6) | 240 ns | 350 ns | 500 ns |
| 1:5 (R = 2.5) | 220 ns | 320 ns | 460 ns |
| 1:4 (R = 1.6) | 200 ns | 290 ns | 420 ns |
| 1:3 (R = 0.4) | 170 na | 240 ns | 340 ns |

Figure 8:
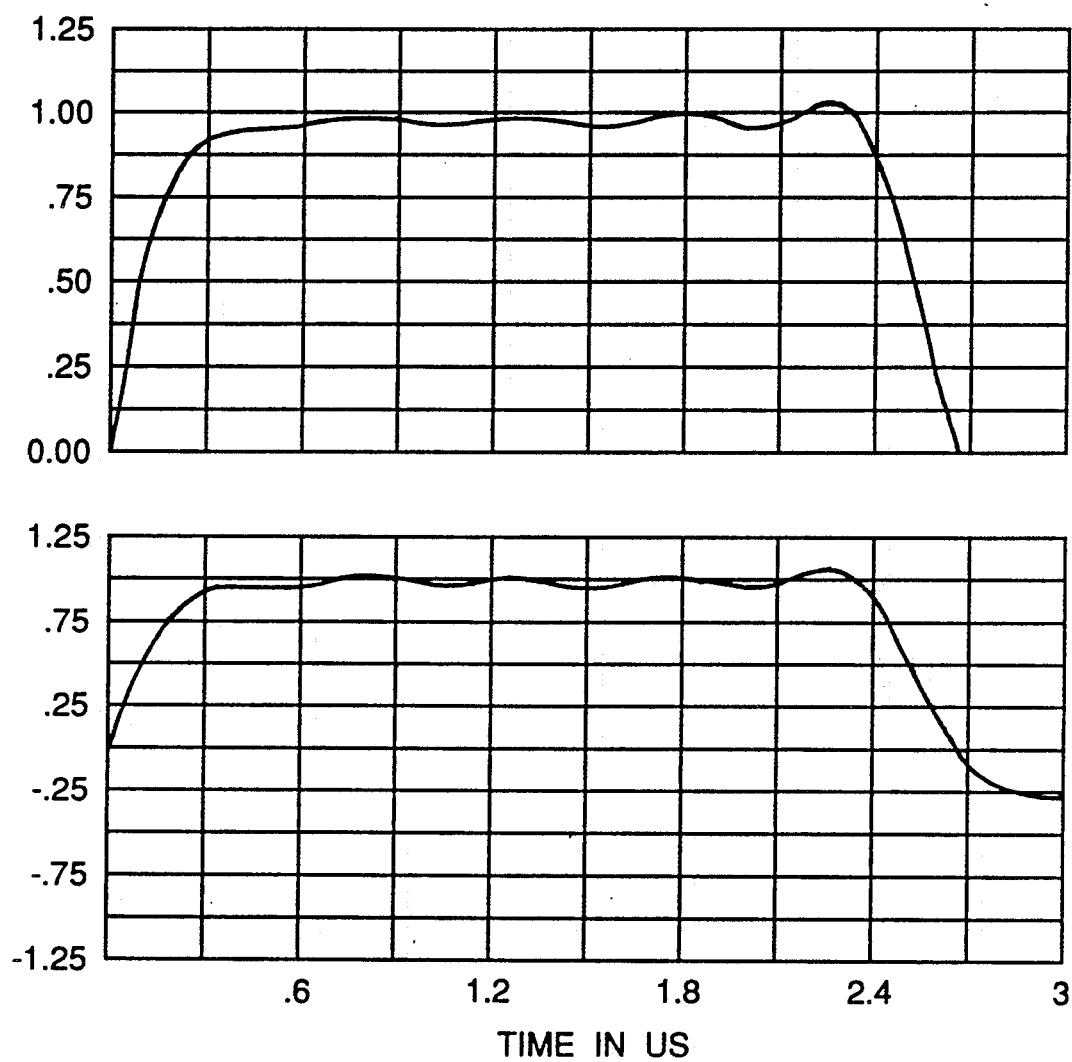
FIG. 8 includes two charts depicting a 100 GW, 250 kJ pulse produced by the system of FIG. 7.
Figure 9:
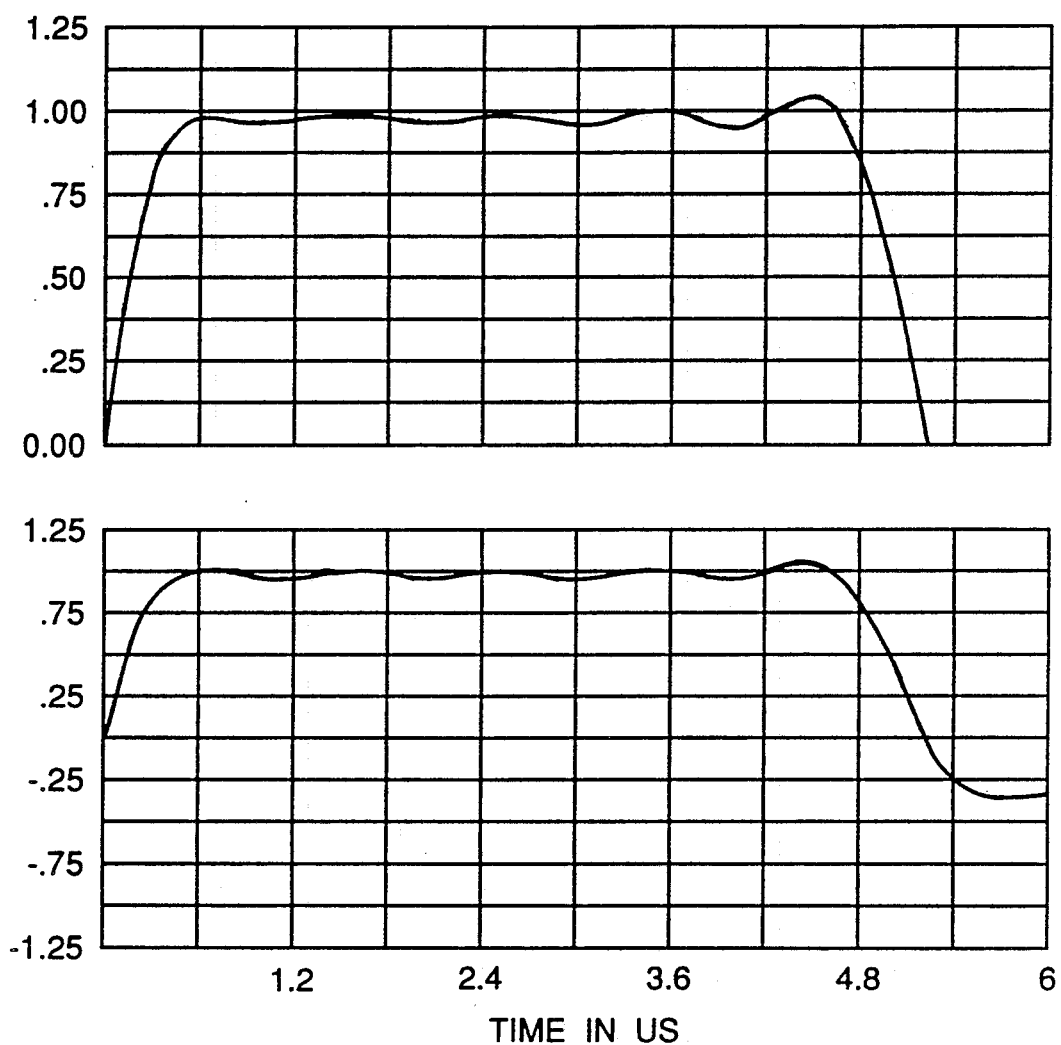
FIG. 9 includes two charts depicting a 100 GW, 500 kJ pulse produced by the system of FIG. 7.
Figure 10:
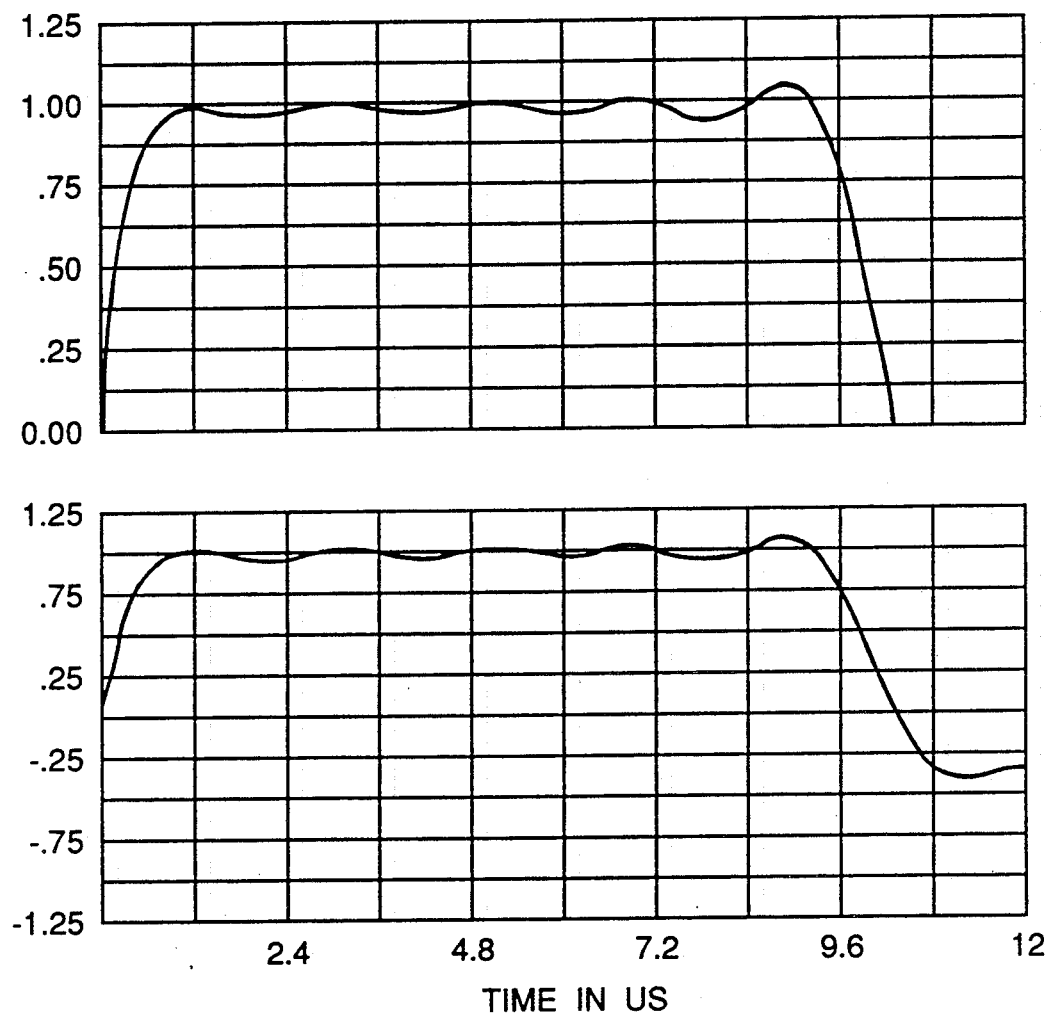
FIG. 10 includes two charts depicting a 100 GW, 1000 kJ pulse produced by the system of FIG. 7.

The network derived above was analyzed on MicroCAP II by Spectrum Software and the results for the 250 kJ, 500 kJ, and 1000 kJ pulses are shown in FIGS. 8, 9 and 10, respectively.

The biggest drawback of the droop compensation network is inefficiency. The capacitance of the type C PFN is of the form:

$$C_n = \frac{4}{n^2 \pi^2} \quad (n - \text{odd}) \quad (23)$$

But the capacitance of the "droop compensated" PFN is of the form:

$$C_n = \frac{4 + 2(RT/L_2)}{n^2 \pi^2} \quad (n = \text{odd}) \quad (24)$$

Yet the pulse shape delivered to the load is the same. This implies that the added $2(RT/L_2)$ reduces the efficiency of the system. By dividing Eq. 24 by Eq. 24, the equation for efficiency is obtained:

$$\eta = \frac{4}{4 + 2(RT/L_2)} \cdot 100\% \quad (25)$$

This is an unfortunate consequence since the efficiencies associated with the 250 kJ, and 1000 kJ PRN's are 62.4%, 60.0%, and 57.8%, respectively. One may note that the efficiency is a function of the term $2(RT/L_2)$. If a poor risetime can be tolerated (i.e. 250 kJ PRN mated to the 1000 kJ transformer), the efficiency can be shown to increase dramatically (the example in the previous parenthesis is 85% efficient). However, in contrast to crow-barred Marx's which are theoretically 19.0% efficient, droop compensated PFN's are still far more efficient. Another interpretation of the dimensionless term $2(RT/L_2)$ is that transformers with cores can be used to generate longer pulses with little compensation since $L_2$ increases with the permeability constant $\mu_r$ over vacuum inductors. But, this concept is not without drawbacks. To operate on the linear region of the B–H curve without saturating, the core must be large, and problems such as interwinding breakdown, which limit the maximum power achievable, introduce drawbacks not encountered by a coreless transformer.

Figure 11:
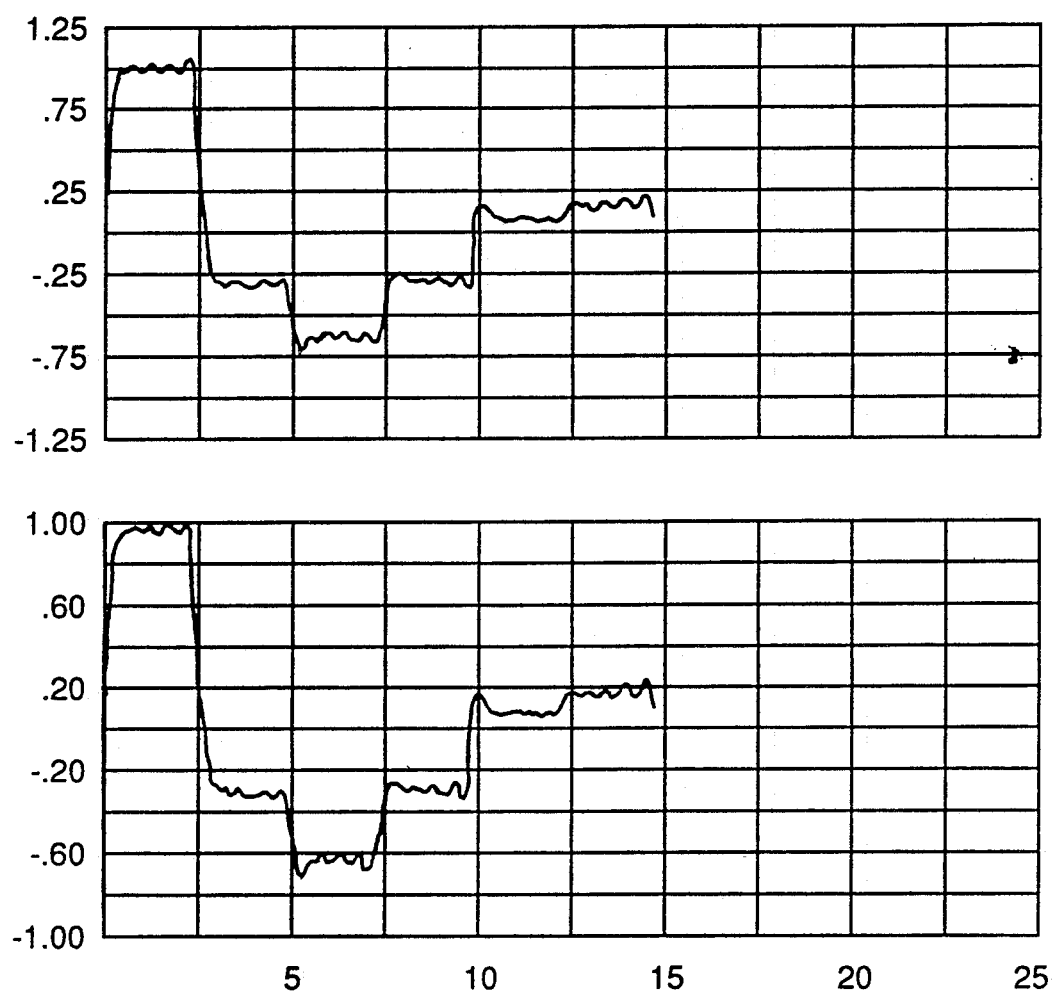
FIG. 11 includes two charts which depict the effects of even uncharged capacitors in the system of FIG. 7.

As a consequence of having uncharged capacitors which become charged and deliver their stored energy to the load at a later time, the system will oscillate until all the energy is dissipated (see FIG. 11). This requires that a crow-bar be used if a backswing cannot be tolerated. The output circuit is inductance insensitive and will accommodate a crow-bar switch without any problems.

It has been shown that a flat top, constant power, long output pulse can be obtained from a droop compensated PFN driven pulse transformer. This is significant since flat top, variable load, long output pulse pulsed power machines in the 10 kJ to a few MJ range are virtually nonexistent.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A droop compensated pulse forming network driven transformer system which receives a voltage signal from a voltage source, and which outputs a transformed droop compensated rectangular pulse to a variably resistive load, said transformed droop compensated rectangular pulse having a selected voltage level, a selected current value, a selected pulse width T, and a droop compensated rectangular pulse shape which remains a constant power pulse as it is output to said variably resistive load, said droop compensated pulse forming network driven transformer system comprising:

a means for producing a rectangular pulse which includes a droop compensated pulse forming network which is electrically connected between said voltage source and said variably resistive load, said droop compensated pulse forming network receiving and processing said voltage signal from said voltage source to output a droop compensated rectangular pulse with said selected pulse width T, at a PFN (pulse forming network) frequency F with a first voltage level and a first current value;

a transformer circuit which electrically connects said droop compensated pulse forming network with said variably resistive load, said transformer circuit receiving and transforming said droop compensated rectangular pulse at said first voltage level and said first current value into said selected voltage level and said selected current value while retaining said selected pulse width and said PFN (pulse forming network) frequency to provide thereby said transformed droop compensated rectangular pulse, wherein said transformer circuit comprises a clock spring wound transformer which is electrically connected between said droop compensated pulse forming network and said variably resistive load, and which contains a primary inductor with a self inductance of $L_1$, and a secondary inductor with a self inductance value of $L_2$, said clock spring wound transformer having a ratio of winding turns between said secondary inductor and said primary inductor that is selected in order to transform said first voltage level and said first current value of said droop compensated rectangular pulse respectively into sad selected voltage level and said selected current value;

wherein said droop compensated pulse forming network comprises a first bank of inductor and capacitor element which are electrically connected between a common electrical ground and said transformer circuit, said first bank of inductor and capacitor elements including a plurality of strings which each contain an inductor and a capacitor which are electrically connected in a series circuit between said ground and said transformer circuit such that each inductor in said first bank has an inductance value given by $L_n = 1/2RT/L_2$ where R equals an average impedance of said variably resistive load, T equals said pulse width, and $L_2$ is the self inductance value of said secondary inductor of said transformer, and wherein each capacitor in said first bank has a value given by $C_n = 2RT/L_2)/n^2\pi^2$ where n is an even integer which begins with 2 and increases for each string in said first bank; and a second bank of inductor and capacitor elements which are electrically connected between said voltage source and said transformer circuit at a point where said first bank is electrically connected with said transformer circuit, said second bank of inductor and capacitor elements including a plurality of strings which each contain an inductor, a capacitor and a resistor which are electrically connected in a series circuit between said voltage source of said transformer circuit such that each inductor in said second bank has an inductance value given by $L_n = \frac{1}{4} + 2(RT/L_2)$, and wherein each capacitor in said second bank has a value given by $C_n = (2RT/L_2)/n^2\pi^2$ where n is an odd integer which begins with 1 and which increases for each string in said second bank.

2. A droop compensated pulse forming network driven transformer system, as defined in claim 1, where said clock spring wound transformer has a single-turn primary inductor and a multi-turn secondary inductor.

3. A droop compensated pulse forming network driven transformer system, as defined in claim 2, wherein said first bank of inductor and capacitor elements has at least five strings of inductor and capacitor elements such that each string in the first bank is electrically connected in a parallel circuit with each other.

4. A droop compensated pulse forming network driven transformer system, as defined in claim 3, wherein said second bank of inductor and capacitor elements has at least five strings of inductor, capacitor and resistor elements such that each string in the second bank is electrically connected in a parallel circuit with the other strings in the second bank.

5. A droop compensated pulse forming network driven transformer system, as defined in claim 4, wherein said voltage source produces said voltage signal at about a 200 kJ level such that said transformer circuit outputs a signal at a 100 GW level into said variably resistive loads with high energy that ranges between 250 to 1,000 kJ.

6. A droop compensated pulse forming network driven transformer system, as defined in claim 5, wherein said selected pulse width ranges between 2.5 to 10.0 microseconds.

7. A droop compensated, pulse forming network driven transformer system, as defined in claim 6, wherein said primary inductor of said transformer circuit has a self inductance value which ranges between about 219.2 nH and 696.1 nH.

8. A droop compensated pulse forming network driven transformer system, as defined in claim 7, wherein said selected pulse width is about 2.5 microseconds so that said transformed droop compensated rectangular pulse has an energy level of about 250 kJ, and wherein all of the inductors in said first bank of inductor and capacitor elements have a self inductance value of about 0.415 μH, and all of the inductors in said second bank of inductor and capacitor elements have a self inductance value of about 0.156 μH.

9. A droop compensated, pulse forming network driven transformer system, as defined in claim 3, wherein said selected pulse width is about 5.0 microseconds so that said transformed droop compensated rectangular pulse has an energy level of about 500 kJ, and wherein all of the inductors in said first bank of inductor and capacitor elements have a self inductance value of about 0.374 μH, and all of the inductors in said second bank of inductor and capacitor elements have a self inductance value of about 0.15 μH.

10. A droop compensated pulse forming network driven transformer system, as defined in claim 9, wherein said selected pulse width is about 10.0 microseconds so that said transformed droop compensated rectangular pulse has an energy level of about 1,000 kJ, and wherein all of the inductors in said first bank of inductor and capacitor elements have a self inductance value of about 0.343 μH, and wherein all of the inductors in said second bank of inductor and capacitor elements have a self inductance value of about 0.144 μH.

11. A droop compensated pulse forming network driven transformer system which receives a voltage signal from a source, and which outputs a transformed droop compensated rectangular pulse to a variably resistive load, said transformed droop compensated rectangular pulse having a selected voltage level, a selected current value, a selected pulse width, and droop compensated rectangular pulse shape which remains a constant power pulse as it is output to said variably resistive load, said droop compensated pulse forming network driven transformer system comprising:

a means for producing a rectangular pulse, said rectangular pulse producing means being electrically connected between said voltage source and said variably resistive load so that it receives and processes said voltage signal from said voltage source to output a droop compensated rectangular pulse with said selected pulse width T, at a PFN (pulse forming network) frequency F, with a first voltage level and a first current value wherein said rectangular pulse producing means comprises a first bank of inductor and capacitor elements which are electrically connected between a common electrical ground and said transformer, said first bank of inductor and capacitor elements including a plurality of strings which each contain an inductor and a capacitor which are electrically connected in a series circuit between said ground and said transformer such that each inductor in said first bank has an inductance value given by $L_n = \frac{1}{2}RT/L_2$ where R equals an average impedance of said variably resistive load, T equals said pulse width, and $L_2$ is the self inductance value of said secondary inductor of said transformer, and wherein each capacitor in said first bank has a value given by $C_n = 2RT/L_2)n^2\pi^2$ where n is an even integer which begins with 2 and increases for each string in said first bank; and a second bank of inductor and capacitor elements which are electrically connected between said voltage source and said transformer at a point where said first bank is electrically connected with said transformer, said second bank of inductor and capacitor elements including a plurality of strings which each contain an inductor, a capacitor and a resistor which are electrically connected in a series circuit between said voltage source of said transformer such that each inductor in said second bank has an inductance value given by $L_n = \frac{1}{4} + 2(RT/L_2)$ and wherein each capacitor in said second bank has a value given by $C_n = (2RT/L_2)/n^2\pi^2$ where n is an odd integer which begins with 1 and which increases for each string in said second bank; and a means for transforming said droop compensated rectangular pulse from said first voltage level and said first current value into said selected voltage level and said selected current value while retaining said selected pulse width and said PFN (pulse forming network) frequency to produce thereby said transformed droop compensated rectangular pulse, said transforming means electrically connected said producing means with said variably resistive load, wherein said transforming means comprises a clock spring wound transformer which is electrically connected between said producing means and said variably resistive load, and which contains a primary inductor with a self inductance of $L_1$, and a secondary inductor with a self inductance value of $L_2$, said clock spring wound transformer having a ratio of winding turns between said secondary inductor and said primary inductor that is selected in order to transform said first voltage level and said first current value of said producing means respectively into said selected voltage level and said selected current value.

12. A droop compensated pulse forming network driven transformer system, as defined in claim 11, where said transformer has a single-turn primary inductor and a multi-turn secondary inductor.

13. A droop compensated pulse forming network driven transformer system, as defined in claim 12, wherein said first bank of inductor and capacitor elements has at least five strings of inductor and capacitor elements such that each string in the first bank is electrically connected in a parallel circuit with each other.

14. A droop compensated pulse forming network driven transformer system, as defined in claim 13, wherein said second bank of inductor and capacitor elements has at least five strings of inductor, capacitor and resistor elements such that each string in the second bank is electrically connected in a parallel circuit with the other strings in the second bank.

15. A droop compensated pulse forming network driven transformer system, as defined in claim 14, wherein said voltage source produces said voltage signal at about a 200 kJ level such that said transformer outputs a signal at a 100 GW level into said variably resistive loads with high energy that ranges between 250 to 1,000 kJ.

16. A droop compensated pulse forming network driven transformer system, as defined in claim 13, wherein said selected pulse width ranges between 2.5 to 10.0 microseconds.

* * * * *